United States Patent [19]

Itemadani et al.

[11] Patent Number: 4,473,247

[45] Date of Patent: Sep. 25, 1984

[54] COMPONENT MOUNTING APPARATUS

[75] Inventors: Eiji Itemadani, Sakai; Kazuhiro Mori, Katano; Sohei Tanaka, Neyagawa; Akira Kabeshita, Moriguchi, all of Japan

[73] Assignee: Matsushita Electric Industrial Co., Ltd., Osaka, Japan

[21] Appl. No.: 348,404

[22] Filed: Feb. 12, 1982

[30] Foreign Application Priority Data

Feb. 13, 1981 [JP] Japan ................................. 56-20585

[51] Int. Cl.³ ........................................... B65G 47/91
[52] U.S. Cl. ....................................... 294/2; 29/740; 294/64 R; 414/752; 414/753
[58] Field of Search ........................... 294/2, 64 R, 106; 414/120, 121, 606, 627, 737, 744 A, 752; 271/9, 30 R, 108; 29/740, 741, 759; 269/23, 156

[56] References Cited

U.S. PATENT DOCUMENTS

| | | | |
|---|---|---|---|
| 2,665,603 | 1/1954 | Hoffman | 269/156 X |
| 3,651,957 | 3/1972 | Ball et al. | 294/106 X |
| 4,135,630 | 1/1979 | Snyder | 29/740 X |
| 4,290,732 | 9/1981 | Taki et al. | 414/752 |
| 4,327,482 | 5/1982 | Araki et al. | 29/740 |
| 4,340,211 | 7/1982 | Chiappetti | 269/156 X |
| 4,346,514 | 8/1982 | Makizawa et al. | 414/752 X |

Primary Examiner—Leslie J. Paperner
Attorney, Agent, or Firm—Birch, Stewart, Kolasch & Birch

[57] ABSTRACT

A component mounting apparatus comprises a hollow rod communicated to a source of vacuum and having a suction head for picking up generally rectangular articles one at a time by the effect of a suction force. At least one pair of finger members for clamping and releasing the articles which has been sucked onto the suction head are provided for effecting a correction in position of the article relative to the suction head. Each of the finger members has an inclined end face which is adapted to support the article sucked onto the suction head from below in engagement with the opposite lower edges of the article.

6 Claims, 17 Drawing Figures

COMPONENT MOUNTING APPARATUS

BACKGROUND OF THE INVENTION

The present invention relates to an automated component mounting apparatus capable of sequentially performing the picking up of components, particularly electric and/or electronic component parts such as chips, one at a time, the transfer thereof from a pick-up station to a mounting station and the mounting thereof on a support such as, for example, a printed circuit board, in an automated manner.

The mounting machine of the type referred to above is well known and is currently utilized in the field of art to which the present invention pertains. A typical mounting machine now used in an electrical industry for automatically mounting miniature electronic component parts (hereinafter referred to as chips) of leadless type on a printed circuit board of boards one at a time utilizes a suction head for sucking the chips one at a time at a pick-up station. The transportation and the subsequent mounting of the chips are carried out while the chip is sucked onto the suction head by the effect of a suction force developed in the suction head. However, so long as the conventional machine is concerned, it has often occurred that the chip sucked onto the suction head is displaced in position relative to the suction head during either or both of the pick-up and transportation thereof, thereby posing a problem associated with the mounting precision.

In order to avoid any possible displacement in position of the chip relative to the suction head, as shown in FIG. 1 of the accompanying drawings illustrating the suction head in longitudinal sectional view, the suction opening of the head 1 has been so designed as to assume a shape convenient and suited to guide the chip 2 being sucked. Even this method lacks a sufficient reliability because the chip sucked onto the suction head tends to tilt and/or the tip of the suction head tends to contact the printed circuit board at the time of mounting thereon onto the printed circuit board.

Apart from the method shown in FIG. 2, another method has been contemplated and is currently used wherein a correcting device is installed on and along the path of transportation of the chips from the pick-up station to a mounting station for correcting the position of the chip relative to the suction head by temporarily placing the chip once picked up at the correcting device and then sucking the chip again in a corrected position. Although the employment of the correcting device is advantageous and effective to minimize an incorrect mounting of the chip on the printed circuit board, not only does it render the machine as a whole to be expensive, but also a loss of time occurs during the transportation of the chip from the pick-up station to the mounting station. In any event, depending on the design of the correcting device, there may be the possibility that the chip placed on and sucked again onto the suction head may displace relative to the suction head.

The U.S. Pat. No. 4,135,630 discloses a similar apparatus effective to avoid the problem inherent in the employment of the correcting device. However, even in the apparatus of this U.S. patent, the following problem is often found to occur when the chip has been inclined or misaligned. Specifically, if attempt is made to correct the position of the chip 2 from four directions, not only does the chip 2 once picked up by the suction head 4 tend to fall by gravity, but also the chip 2 tends to be incorrectly held by the suction head 4 with its one end sucked thereto as shown in FIG. 2(a), or with a corner portion thereof sucked onto the suction head as shown in FIG. 2(b).

SUMMARY OF THE INVENTION

Accordingly, the present invention has been developed with a view to substantially eliminating these disadvantages and inconveniences inherent in the prior art apparatuses and has for its essential object to provide an improved mounting apparatus reliable in operation and effective to pick up and hold the chips one at a time in correct position without relying on such a correcting device as used in the prior art apparatus.

BRIEF DESCRIPTION OF THE DRAWINGS

This and other objects and features of the present invention will become clear from the following description taken in conjunction with a preferred embodiment thereof with reference to the accompanying drawings, in which:

FIG. 10, including

DETAILED DESCRIPTION OF THE INVENTION

Figure 1:
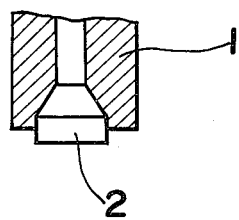
FIG. 1 is a longitudinal sectional view of the suction head used in the prior art apparatus.

Before the description of the present invention proceeds, it is to be noted that like parts are designated by like reference numerals throughout the accompanying drawings.

Figure 3:
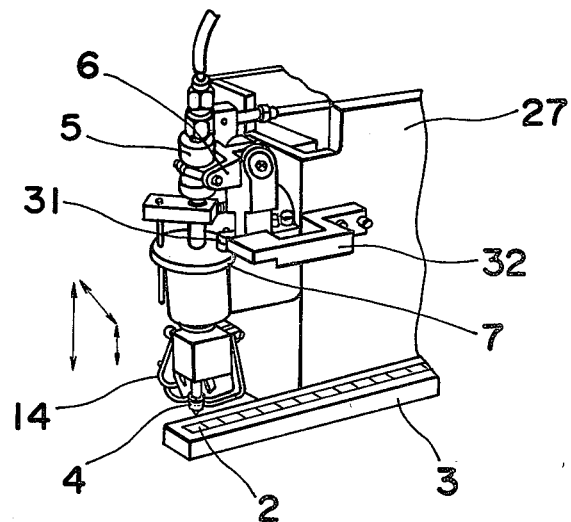
FIG. 3 is a perspective view of an essential portion of a mounting apparatus according to the present invention.
Figure 4:
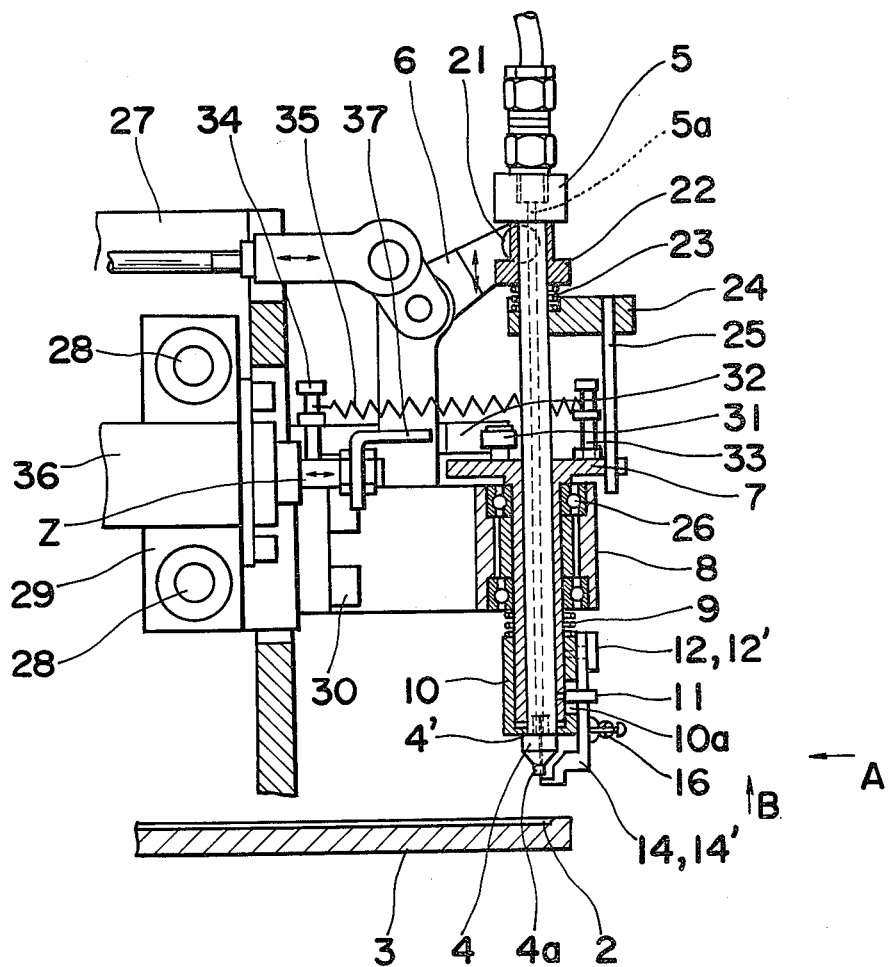
FIG. 4 is a longitudinal side sectional view, on an enlarged scale, of the essential portion of the apparatus shown in FIG. 3.
Figure 11:
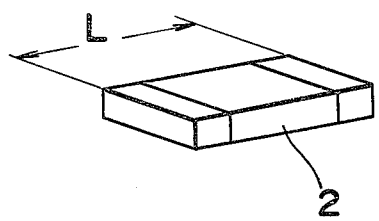
FIG. 11 is a perspective view of a generally rectangular chip with which the apparatus of the present invention can work.

Referring first to FIGS. 3 and 4, a component mounting apparatus according to the present invention comprises a suction head or cup 4 in the form of a generally elongated nozzle adapted to pick up one at a time chips 2 which have been supplied to a pick-up station beneath the suction cup 4 in a row by means of a vibrating chute 3. Each of the chips 2 with which the apparatus so far illustrated can work is shown in FIG. 11 and is of a generally rectangular configuration. As best shown in FIG. 4, the suction cup 4 is carried by a lower end of a rod 5 which is supported for movement between upper and lower positions. This rod 5 is so operatively coupled to a rocker lever 6, adapted to be driven by an external driving mechanism (not shown), that the rod 5 can be axially moved between the upper and lower positions with a driving force transmitted thereto through a roller 21, a slide ring 22, a compression spring 23 and a lever 24 fixedly mounted on the rod 5. The compression spring 23 is utilized for adjusting to a predetermined value the pressure of contact of the suction cup 4 to each of the chips 2 when the latter are to be sucked onto the suction cup at the pick-up station. The rod 5 and the suction cup 4 have suction passages 5a and 4a respectively defined therein and communicated to each other, the opening of the suction passage 5a at the other, upper end of the rod 5 being fluid-connected to a source of vacuum (not shown).

The rod 5 extends axially movably through a rotary boss 7 and is rotatable together with the rotary boss 7 through a predetermined angle, for example, 90°, about its own longitudinal axis in a manner as will subsequently be described. The rotary boss 7 is supported by a movable block 8 by means of bearings 26 and is adapted to be rotated about its own longitudinal axis through a predetermined angle, for example, 90°, between first and second positions. For preventing the rod 5 from rotating independently of the rotary boss 7 and for transmitting the rotation of the rotary boss 7 to the rod 5, a guide rod 25 having one end rigidly connected to the rod 5 through the lever 24 extends axially movably through a flange of the rotary boss 7. The movable block 8 supporting the rotary boss 7 is in turn secured by means of set bolts 30 to a slider block 29 slidably mounted on a pair of spaced and parallel guide rods 28 and 28', each carried at its opposite ends by a machine framework 27, so that the movable block 8 can be moved by a suitable drive means (not shown) along the guide rods 28 and 28' in a plane perpendicular to the direction of movement of the rod 5.

Figure 13:
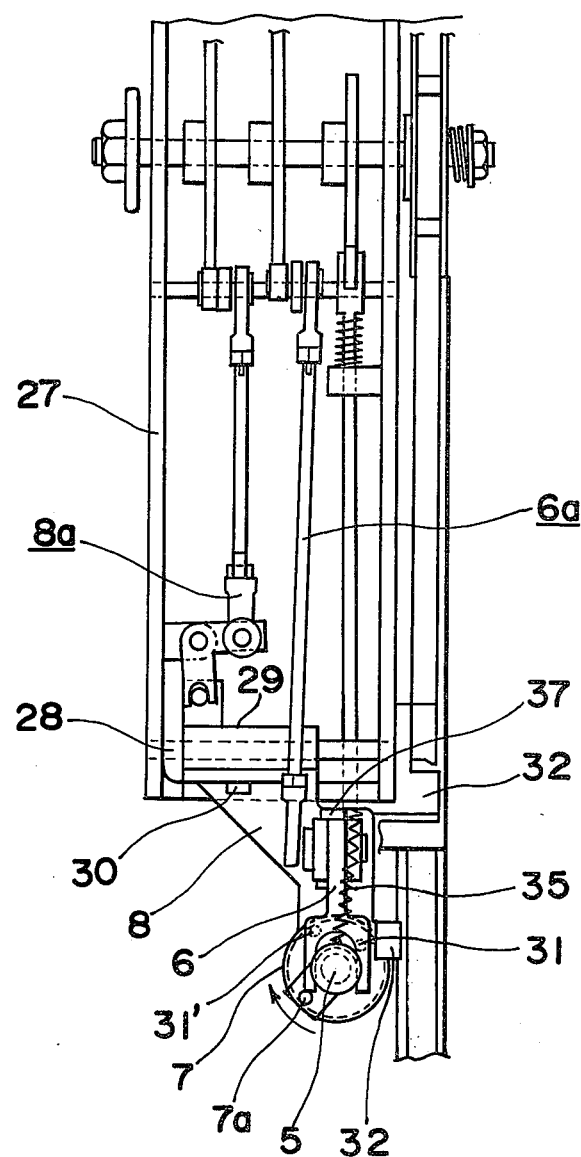
FIG. 13 is a plan view, partially broken away, in an enlarged scale, showing a driving mechanism for the feed pawl employed within the apparatus of FIG. 3.

The rotary boss 7 so supported by the block 8 is normally biased to the first position with a roller 31 on the boss 7 held in contact with a cam 32 fast with the machine framework 27 and, for this purpose, a tension spring 35 is used having its opposite ends engaged to pins 33 and 34 which are respectively rigidly mounted on the boss 7 and the block 8. Since the roller 31 and the cam 32 are always engaged to each other when the movable block 8 is horizontally moved a predetermined distance, the rotary boss 7 is possible to rotate through 90° about its own longitudinal axis. Hereinafter, a releasing mechanism for releasing the 90° rotation of the rod 5 will be described. An air cylinder 36 rigidly carried by the slider block 29 has its free end to which a stopper 37 is secured. This stopper 37 can move in a direction shown by the arrow Z in FIG. 4 by the operation of the air cylinder 36. At the time the 90° rotation of the rod 5 is to be released, the stopper 37 is advanced to contact a predetermined portion of the rotary boss 7 thereby to lock the biasing force of the tension spring 35. In the releasing mechanism, it is so arranged that, when the rotation of the rotary boss 7 is not necessary, the stopper 37 is moved forward in the direction marked by the arrow Z in the enclosed FIG. 4 upon actuation of the cylinder 36 so that the stopper 37 may be brought into contact with the pin 31' provided on the rotary boss 7, (which pin 31' shown in the enclosed FIG. 13 is equivalent to the pin 31' of FIG. 4) at whereby the rotation of the rotary boss 7 is blocked.

Figure 5:
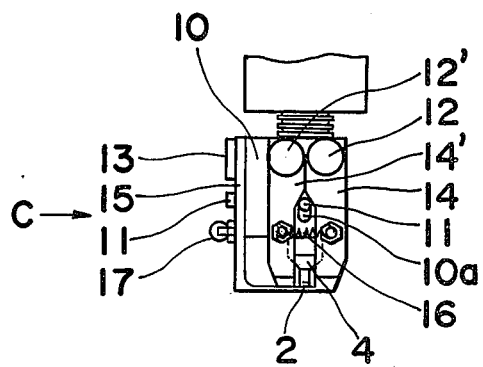
FIG. 5 is a front elevational view of a suction head and its associated parts of the apparatus of the present invention as viewed in a direction shown by the arrow A in FIG. 4.
Figure 6:
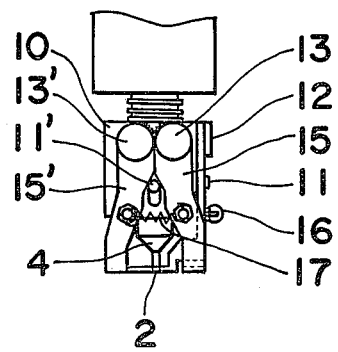
FIG. 6 is a side elevational view of the suction head and its associated parts of the apparatus as viewed in a direction shown by the arrows C in FIG. 5.
Figure 7:
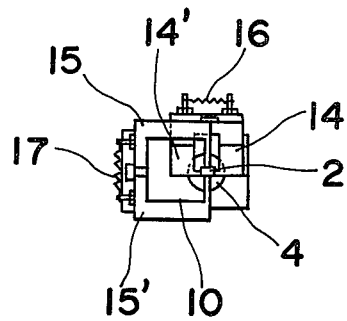
FIG. 7 is a bottom plan view of the suction head and its associated parts as viewed in a direction shown by the arrow B in FIG. 4.
Figure 8:
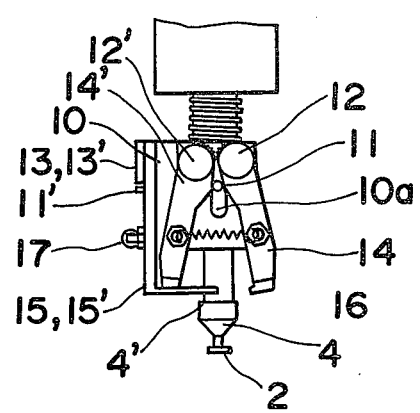
FIG. 8 is a view similar to FIG. 5, showing the suction head and its associated parts in different operative position.
Figure 9:
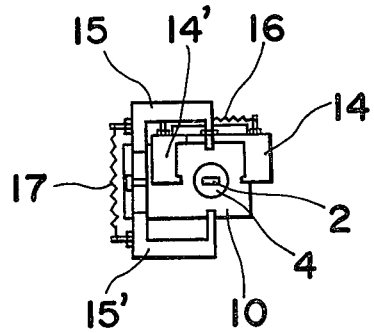
FIG. 9 is a view similar to FIG. 7, showing the suction head and its associated parts in different operative position.

The machine further comprises a position correcting mechanism for correcting the position of the chip after the latter has been picked up by the suction cup 4, which mechanism will now be described. An axially slidable sleeve 10 is axially slidably mounted on a lower end portion of the rotary boss 7 between the suction cup 4 and the movable block 8 and is normally biased towards the suction cup 4 by the action of a compression spring 9. Guide pins 11 and 11' rigidly secured to and extending outwardly from the rotary boss 7 in respective directions at right angles to each other are engaged slidingly in slots 10a defined axially in the slidable sleeve 10 so that the sleeve 10 can rotate together with the rotary boss 7, but can be axially movable relative to the rotary boss 7. As can be understood from FIGS. 7 and 9, the slidable sleeve 10 is of a generally square cross-section and carries first and second pairs of finger members 14, 14' and 15, 15'. The first pair of the finger members 14 and 14' are pivotally connected at one end to one surface of the sleeve 10 by means of respective set bolts 12 and 12' whereas the second pair of the finger members 15 and 15' are pivotally connected at one end by means of respective set bolts 13 and 13' to another surface of the sleeve 10 which lies perpendicular to said one surface, as best shown in FIGS. 5 and 6. So far shown in FIG. 4, the rod 5 is moved to the upper position together with the suction cup 4 with a shoulder portion 4' of the suction cup 4 lifting the slidable sleeve 10 against the compression spring 9 whereby the first pair of the finger members 14 and 14' are held in a closed position to correct the position of the sucked chip 2 from one direction in which the finger members 14 and 14' pivot about the set bolts 12 and 12'.

More specifically, each pair of the finger members 14, 14' or 15, 15' have partial gears so defined at respective portions of the finger members 14 and 14' or 15 and 15' adjacent the associated bolts 12 and 12' or 13 and 13' that the pivotal movement of one finger member 14 or 15 can be transmitted to the other finger member 14' or 15' in such a manner that the finger members 14 and 14' or 15 and 15' pivot in a direction close towards and away from each other between closed and opened position, as best shown in FIGS. 5 to 9. Normally, each pair of the finger members 14, 14' and 15, 15' are biased by a respective tension spring 16 or 17, extending therebetween, to assume the closed position as shown in FIG. 5 or FIG. 6. In this construction of the correcting mechanism, when the rod 5 and, hence, the suction cup 4 descends, the compression spring 9 expands axially outwardly and urges the sleeve 10 downwards and the sleeve 10 moves axially downwards in contact with the shoulder portion 4' of the suction cup 4 until the guide pins 11 and 11' fast with the boss 7 contact respective upper ends of the slots 10a in the sleeve 10. As the guide pins 11 and 11' relatively approach the respective upper ends of the slots 10a in the sleeve 10 being then moved downwards in the manner described above, the pins 11 and 11' are forced to enter in between the finger members 14 and 14' and between the finger members 15 and 15', respectively, thereby causing the first and second pairs of the finger members 14, 14' and 15, 15' to pivot towards the opened position against the associated tension springs 16 and 17. The pivotal movement of the finger members of each pair to the opened position is synchronized with the arrival of the rod 5 and, hence, the suction cup 4 at the lower position at which the frontmost one of the chips in a row on the chute 3 can be picked up by the suction cup 4 by the effect of the suction force developed inside the passages 4a and 5a.

Subsequent upward movement of the suction cup 4 incident to the movement of the rod 5 from the lower position towards the upper position causes the finger members 14 and 14' or 15 and 15' of each pair to pivot from the opened position towards the closed position as biased by the respective tension spring 16 or 17, whereby the position of the chip 2 sucked onto the suction cup 4 can be corrected from four directions with its center aligned with the suction cup 4.

Figure 10A:
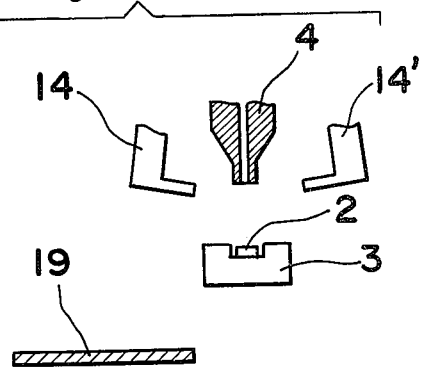
FIGS. 10(a) to 10(d), is a front elevational view showing the sequence of position correcting performed by the apparatus of the present invention.
Figure 10C:
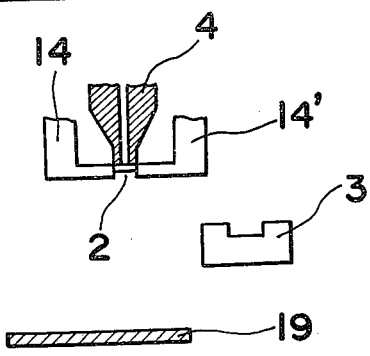
Figure 10B:
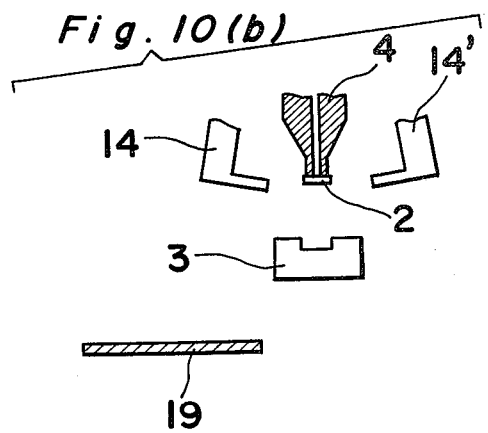
Figure 10D:
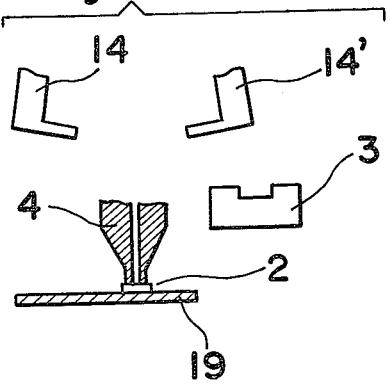

The principle of the position correction achieved by the correcting mechanism will now be described with particular reference to FIG. 10 which illustrates the sequence of operation of only the first pair of the finger members 14 and 14' for the sake of brevity, it being, however, to be understood that the following description made with reference to FIG. 10 can equally apply to the second pair of the finger members 15 and 15'. Referring first to FIG. 10(a), the suction cup 4 is shown as positioned immediately above the frontmost one of the chips 2 successively supplied in a row towards the pick-up station by means of the vibrating chute 3 with the finger members 14 and 14' held in the opened position. FIG. 10(b) shows the condition in which the suction cup 4 has sucked the frontmost chip and, even in this condition, the finger members 14 and 14' are still held in the opened position. As shown in FIG. 10(c), during the transport of the chip 2 from the pick-up station above the vibrating chute 3 towards the mounting station immediately above a printed circuit board 19, the finger members 14 and 14' are pivoted to assume the closed position to correct the position of the chip 2 relative to the suction cup 4. Subsequently, the finger members 14 and 14' are caused to pivot towards the opened position to allow the suction cup 4 to descend through a space between the finger members 14 and 14' until the chip 2 is mounted on the printed circuit board 19 as shown in FIG. 10(d).

It is to be noted that, while the finger members 14 and 14' pivot in one plane parallel to the longitudinal axis of the rod 5, the finger members 15 and 15' pivot in a different plane perpendicular to said one plane.

Figure 2A:
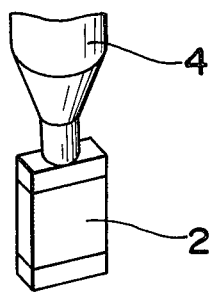
FIGS. 2(a) and 2(b) are schematic diagrams showing the different manners in which the chip is incorrectly sucked onto the suction head used in another prior art apparatus.
Figure 2B:
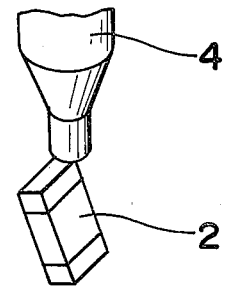
Figure 12:
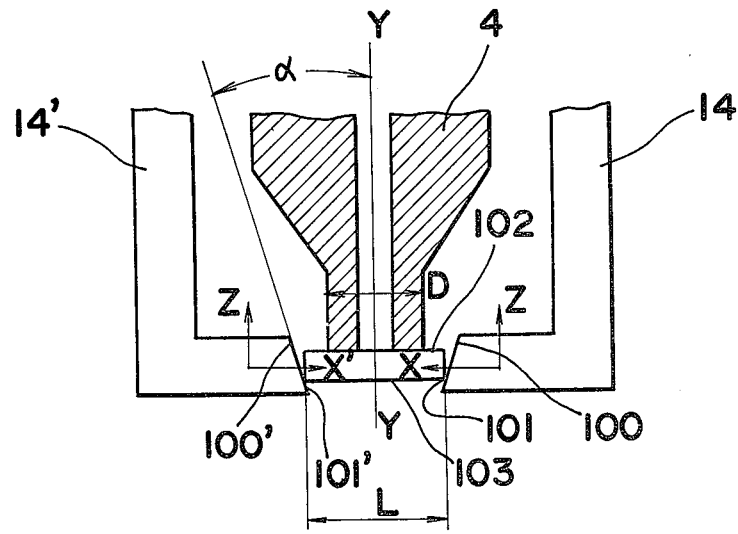
FIG. 12 is a front elevational view, on a further enlarged scale, showing schematically the suction head and its associated parts for the purpose of illustration of the manner by which the position of the chip relative to the suction cup can be corrected.

Referring now to FIG. 12, which illustrates only the first pair of the finger members 14 and 14' for the sake of brevity as is the case with FIG. 10, respective portions of the finger members 14 and 14' which are adapted to contact the opposite lower edges 101 and 101' of each chip 2 to support the latter from below are downwardly inclined at 100 and 100' so as to converge at a point below the suction cup 4. By so designing, it is possible to cause the finger members 14 and 14' in the closed position, while the chip 2 is sucked onto the suction cup 4, to apply pressing force to the chip 2 in the opposite directions close towards each other as shown by the arrows X and X'. In addition to the pressing forces acting on the sucked chip 2 in the directions X and X', vector components of the pressing forces act on the sucked chip in respective directions shown by the arrows Z and, therefore, not only can the chip be held in correctly registered position relative to the suction cup 4 in the event that the chip so picked up by the suction cup 4 has been tilted or displaced, but also the chip 2 can assuredly be sucked onto the suction cup 4 with no possibility of separating away therefrom. In view of this, there is no possibility of each chip being picked up by the suction cup in a tilted and/or displaced manner such as shown in FIGS. 2(a) and 2(b).

Since each chip has its lower surface 103 defined by a layer of ceramic material and an upper surface defined by a coating of glass material, the provision of the inclined faces 100 and 100' at the respective tips of the finger members 14 and 14' or 15 and 15' is advantageous in avoiding any possible damages to the glass coated upper surface 102 of the chip 2.

Referring still to FIG. 12, it is preferred that the outer diameter D of the tip of the suction cup 4 which tip contacts the chip 1 is equal to or greater than two-third of the length L of the rectangular chip 2. In such case, in consideration of any possible influence a pressing force developed between the suction cup 4 and the surface 102 of the chip 2 may bring about during the position correction, it has been found preferable that the angle of inclination, shown by $\alpha$, of each of the faces 100 and 100' is within the range of 5° to 10° relative to the longitudinal axis Y—Y of the suction cup 4.

If the angle $\alpha$ of inclination is greater than 10°, the pressing force the suction cup 2 brings on the chip 2 will become large to such an extent as to result in damage to the surface 102 of the chip 2 which may lead to the reduction in characteristic of the chip. In addition, the larger the pressing force, the greater the possibility of the chip falling off from the suction cup 4. On the other hand, if the angle $\alpha$ is smaller than 5°, there is the possibility that the tips of the finger members may not contact the lower edges 101 and 101' of the chip 2 in view of the fact that the opposite end faces of the chip have indents and, accordingly, the chip may not be firmly sucked and retained by the suction cup 4.

It is to be noted that the preferred arrangement described with references to FIG. 12 in connection with the first pair of the finger members 14 and 14' can equally apply to the second pair of the finger members 15 and 15'.

From the foregoing description, it has now become clear that the inclined faces at the tips of the finger members are effective to urge the sucked chip upwardly when the finger members are in the closed position without impairing the fragile surface of the chip. Accordingly, the chip so sucked onto the suction cup 4 can be transported from the pick-up station towards the mounting station without any possibility of the chip falling off from the suction head. Specifically, the particular shape of each of the tips of the finger members described hereinbefore is effective to assist in suction retention of the chip by the suction head, thereby eliminating the disadvantages and inconveniences generally inherent in the prior art apparatuses.

Although the present invention has fully been described in connection with the preferred embodiment thereof with reference to the accompanying drawings, it is to be noted that various changes and modifications are apparent to those skilled in the art. Such changes and modifications are to be understood as included within the true scope of the present invention unless they depart therefrom.

We claim:

1. A component mounting apparatus comprising:

a hollow rod communicated to a source of vacuum and having a suction head for picking up generally rectangular articles one at a time by the effect of a suction force, said suction head being rigidly connected to a lower end of the hollow rod;

a support structure for supporting the hollow rod for movement in a horizontal direction and also in a vertical direction;

at least a first pair of finger members supported for movement together with the hollow rod and movable in the opposite directions close towards and away from each other for clamping and releasing, respectively, said article which has been sucked onto the suction head; and means for causing the first pair of finger members to move in the opposite directions close towards and away from each other selectively, said finger members of the first pair having their free end faces inclined at an angle in the range of approximately 5° to 10° relative to the longitudinal axis of the suction head to support the opposite lower edges of the article from below so that, when the article is to be clamped therebetween, the inclined free end faces of the finger members push the article to attach the suction head.

2. An apparatus as claimed in claim 1, further comprising a second pair of finger members of identical construction with the first pair of the finger members, said finger members of the second pair being pivotable in a plane at right angles to the plane in which the finger members of the first pair pivot.

3. An apparatus according to claim 1, and further including a tension spring operatively mounted between said pair of finger members for normally biasing said finger members to a closed position.

4. An apparatus according to claim 1, and further including partial gears operatively positioned between said pair of finger members for transmitting pivotal movement of one finger member to the other finger member.

5. An apparatus according to claim 2, and further including a tension spring operatively mounted between said second pair of finger members for normally biasing said second pair of finger members to a closed position.

6. An apparatus according to claim 2, and further including partial gears operatively positioned between said second pair of finger members for transmitting pivotal movement of one of said second pair of finger members to the other finger member.

* * * * *